United States Patent
Goto

(10) Patent No.: US 7,205,834 B2
(45) Date of Patent: Apr. 17, 2007

(54) POWER AMPLIFIER

(75) Inventor: Masao Goto, Saitama (JP)

(73) Assignee: Sony Corporation, Tokyo (JP)

( * ) Notice: Subject to any disclaimer, the term of this patent is extended or adjusted under 35 U.S.C. 154(b) by 114 days.

(21) Appl. No.: 10/521,725

(22) PCT Filed: Jun. 6, 2003

(86) PCT No.: PCT/JP03/07224

§ 371 (c)(1),
(2), (4) Date: Jan. 18, 2005

(87) PCT Pub. No.: WO2004/010575

PCT Pub. Date: Jan. 29, 2004

(65) Prior Publication Data

US 2005/0231276 A1    Oct. 20, 2005

(30) Foreign Application Priority Data

Jul. 18, 2002    (JP)    ............................ 2002-209557

(51) Int. Cl.
*H03F 3/38*    (2006.01)
*H03F 3/04*    (2006.01)
*H03F 1/52*    (2006.01)
(52) U.S. Cl. ...................... 330/10; 330/298; 330/207 P
(58) Field of Classification Search .................... None
See application file for complete search history.

(56) References Cited

U.S. PATENT DOCUMENTS 4,107,618 A * 8/1978 Ormond ...................... 330/51
4,949,048 A * 8/1990 Tokumo et al. .............. 330/10

(Continued)

FOREIGN PATENT DOCUMENTS

JP    6-196941 A    7/1994

(Continued)

*Primary Examiner*—Benny T. Lee
*Assistant Examiner*—Krista Flanagan
(74) *Attorney, Agent, or Firm*—Wolf, Greenfield & Sacks, P.C.

(57) ABSTRACT

In a power amplifier driven by a pulse width modulation (PWM) signal, a first pair of drive pulses opposite in level to each other is formed from a first pulse width modulation signal whose quantization level corresponds to its pulse width and supplied to a first push-pull circuit (15). A second pair of drive pulses opposite in level to each other is formed from a second pulse width modulation signal whose two's complement of quantization level corresponds to its pulse width, and supplied to a second push-pull circuit (16). A speaker (19) is connected between the first and second push-pull circuits (15 and 16). A deviation between potentials at the output terminals of the first and second push-pull circuits (15 and 16), respectively, is detected. When a deviation is detected, the push-pull circuits are substantially stopped from operating.

10 Claims, 7 Drawing Sheets

U.S. PATENT DOCUMENTS

| | | | | |
|---|---|---|---|---|
| 4,992,749 | A * | 2/1991 | Tokumo et al. | 330/10 |
| 5,451,900 | A * | 9/1995 | Haga et al. | 330/10 |
| 5,621,352 | A * | 4/1997 | Botti et al. | 330/51 |
| 5,729,174 | A * | 3/1998 | Dunnebacke et al. | 330/51 |
| 5,920,229 | A * | 7/1999 | Kokubo | 330/51 |
| 6,396,341 | B1 * | 5/2002 | Pehlke | 330/10 |
| 6,831,508 | B2 * | 12/2004 | Shima | 330/10 |
| 6,844,777 | B2 * | 1/2005 | Kitamura | 330/10 |
| 6,856,192 | B2 * | 2/2005 | Muramatsu | 330/10 |
| 6,917,242 | B2 * | 7/2005 | Masuda et al. | 330/10 |
| 6,949,974 | B2 * | 9/2005 | Ohnishi et al. | 330/124 R |
| 6,992,527 | B2 * | 1/2006 | Yokoyama | 330/10 |
| 7,030,691 | B2 * | 4/2006 | Kim | 330/51 |

FOREIGN PATENT DOCUMENTS

| | | | |
|---|---|---|---|
| JP | 06-196941 A | * | 7/1994 |
| JP | 09-116353 A | * | 5/1997 |
| JP | 9-116353 A | | 5/1997 |
| JP | 2000-174571 A | * | 6/2000 |
| JP | 3189605 B2 | | 5/2001 |
| JP | 3189605 B2 | * | 7/2001 |
| JP | 2002-158542 A | * | 5/2002 |
| JP | 2002-158544 A | * | 5/2002 |

* cited by examiner

POWER AMPLIFIER

TECHNICAL FIELD

The present invention relates to a pulse width modulation (PWM) signal-driven power amplifier.

This application claims the priority of the Japanese Patent Application No. 2002-209557 filed on Jul. 18, 2002, the entirety of which is incorporated by reference herein.

BACKGROUND ART

Conventionally, there is available a digital amplifier called "D-class amplifier" as an audio power amplifier. The D-class amplifier amplifies a power by switching, and it is constructed as shown in FIG. 1 for example.

In the power amplifier shown in FIG. 1, digital audio signal Pin is supplied to a PWM circuit 11 via an input terminal Tin, and clock signal having a predetermined frequency is supplied from a clock generator 12 to the PWM circuit 11. The digital audio signal Pin supplied to the PWM circuit 11 is converted into a pair of PWM signals PA and PB.

As shown in FIGS. 2A and 2B the pulse width of the PWM signals PA and PB, or a time duration for which the waveform of each PWM signal keeps "H" level, varies correspondingly to a quantization level the digital audio signal Pin takes (corresponding to a momentary level of the signal Pin when the signal is converted from digital to analog). The pulse width of one of the PWM signal PA corresponds to the magnitude of the quantization level the digital audio signal Pin itself takes, while the pulse width of the other PWM signal PB corresponds to the magnitude of two's complement of the quantization level the digital audio signal Pin takes.

Note that the PWM signals PA and PB shown in FIGS. 2A and 2B rise only at the start time point of one time cycle (reference period) TC of the PWM signals PA and PB, and falls at a time point varying correspondingly to a level the digital audio signal Pin takes. That is, the PWM signals PA and PB are a so-called unilateral modulation signal.

The PWM signals PA and PB may be a so-called bilateral modulation signal which rises and falls at time points, respectively, varying simultaneously as shown in FIGS. 2C and 2D.

The carrier frequency fc (=1/TC) of the PWM signals PA and PB is 16 times of a sampling frequency fs of the digital audio signal Pin, and it will be as follows when fs=48 kHz:

$fc=16fs=16\times 48$ kHz$=768$ kHz

One of the PWM signals, PA, from the PWM circuit 11 is supplied to a drive circuit 13 where it will be inverted and not inverted to provide a pair of driving pulse voltages (drive pulse) +PA and −PA as shown in FIG. 3A.

The pulse voltages +PA and −PA from the drive circuit 13 are supplied to gates of switching elements, for example, a pair of n-channel MOS-FETs (metal oxide semiconductor type field effect transistor), 151 and 152, respectively.

In this example, the FETs (field effect transistor) 151 and 152 are included in a push-pull circuit 15 in which the FET 151 is connected at the drain thereof to a power terminal 20 while being connected at the source to the drain of FET 152 which is connected at the source thereof to the ground potential. The power terminal 20 is supplied with a stable DC voltage +VDD as a source voltage. It should be noted that the voltage +VDD is 20 to 50 V for example.

The source of FET 151 and drain of FET 152 are connected to a speaker terminal SP+, to which a speaker 19 is connected at one side thereof, via a low-pass filter 17 including a coil and capacitor.

The circuit construction for the other PWM signal PB from the PWM circuit 11 is similar to that for the PWM signal PA. That is, the PWM signal PB is supplied to the drive circuit 14 where it will be inverted and not inverted to provide a pair of driving pulse voltages (drive pulse) +PB and −PB as shown in FIG. 3B.

The pulse voltages +PB and −PB from the drive circuit 14 are supplied to gates of switching elements, for example, a pair of n-channel MOS-FETs 161 and 162, respectively, included in the push-pull circuit 16.

The source of FET 161 and drain of FET 162 are connected to a speaker terminal SP−, to which the speaker 19 is connected at the other side thereof, via a low-pass filter 18 including a coil and capacitor.

Therefore, when the pulse voltage +PA is "H", the pulse voltage −PA is "L" and FET 151 turns on while FET 152 turns off. Thus, a voltage VA at the junction between FETs 151 and 152 is the voltage +VDD as shown in FIG. 3C. Reversely, when the pulse voltage +PA is "L", the pulse voltage −PA is "H" and FET 151 turns off while FET 152 turns on. Thus, the voltage VA is 0.

Similarly, when the pulse voltage +PB is "H", the pulse voltage −PB is "L" and FET 161 turns on while FET 162 turns off. Thus, a voltage VB at the junction between FETs 161 and 162 is the voltage +VDD as shown in FIG. 3D. Reversely, when the pulse voltage +PB is "L", the pulse voltage −PB is "H" and FET 161 turns off while FET 162 turns on. Thus the voltage VB is 0.

During a period for which the voltage VA is +VDD and voltage VB is 0, a current i will flow from the junction between FETs 151 and 152 to the junction between FETs 161 and 162 through a line extending from the low-pass filter 17 to the low-pass filter 18 via the speaker 19, as shown in FIGS. 1 and 3E. FIG 3F shows clock signal CLK.

Also, during a period for which the voltage VA is 0 and voltage VB is +VDD, the current i will flow reversely from the junction between FETs 161 and 162 to the junction between FETs 151 and 152 through a line extending from the low-pass filter 18 to the low-pass filter 17 via the speaker 19. During a period for which VA=VB=+VDD and a period for which VA=VB=0, the current i will not flow because the push-pull circuits 15 and 16 form together a bright tied load (BTL) circuit.

Since the period for which the current i flows varies correspondingly to a period for which the original PWM signals PA and PB are rising and the current i is integrated by the low-pass filters 17 and 18 while flowing through the speaker 19, so the current i flowing through the speaker 19 is an analog current corresponding to the level the digital audio signal Pin takes and which has been power-amplified. That is, a power-amplified output will be supplied to the speaker 19.

The circuit shown in FIG. 1 works as a power amplifier. Since FETs 151 and 152, and 161 and 162, amplifies a power by switching the source voltage +VDD correspondingly to the input digital audio signal Pin, so the power amplifier can provide a large output with a high efficiency.

In the circuit constructed as shown in FIG. 1, however, if a speaker cord connected at one end thereof to one of the speaker terminals SP+ and SP− is put in contact with a chassis or metal piece when the speaker 19 is wired to the speaker terminals SP+ and SP−, for example, with the power amplifier kept energized, a large current will flow through either of the push-pull circuits 15 and 16 at the output stage shown in FIG. 1 and FETs 151 and 152, and 161 and 162, included in the push-pull circuit will possibly be damaged.

Also, if the speaker connected, by a lead wire connected to one end thereof, to the speaker terminal SP+ or SP− is put in contact, at a lead wire connected to the other end thereof, with a metallic portion, a large current will flow through the circuit and FETs 151 and 152, and 161 and 162, at the output stage included in the push-pull circuit will possibly be damaged. At this time, the speaker will possibly be broken down (burnt out).

To prevent the above accident, an overcurrent protection circuit is normally provided in the above-mentioned power amplifier. FIG. 4 is a circuit diagram of a conventional power amplifier in which an overcurrent protection circuit is additionally provided.

As shown in FIG. 4, the power amplifier has an overcurrent protection circuit 21 provided between the output-stage push-pull circuits 15 and 16 and the power terminal 20.

More specifically, In the overcurrent protection circuit 21, the power terminal 20 is connected to the ground potential via a capacitor 211, and also via a series circuit composed of a resistor 212 and capacitor 213. The power terminal 20 is connected to the emitter of an overcurrent detection transistor 214. The junction between the resistor 212 and capacitor 213 is connected to the drains of FETs 151 and 161, and the source voltage +VDD is connected to the push-pull circuits 15 and 16 through the resistor 212.

The junction between the resistor 212 and capacitor 213 is connected to the base of the overcurrent detection transistor 214. This transistor 214 is connected at the collected thereof to the base of a transistor 215 whose emitter is connected to the ground potential. The transistor 215 supplies its collector output as an overcurrent detection signal to a microcomputer 22.

When the microcomputer 22 determines, based on the supplied collector output from the transistor 215, that an overcurrent has been detected, it will control the drive circuits 13 and 14 to suspend outputting the drive signals +PA and −PA, and +PB and −PB, and also FETs 151 and 152, and 161 and 162, to always be off.

The overcurrent protection circuit 21 constructed as above functions as will be described below. In the circuit construction shown in FIG. 4, the source voltage +VDD from the power terminal 20 is supplied to the push-pull circuits 15 and 16 through the resistor 212.

In the normal operation of the overcurrent protection circuit 21, since the current i flowing through FETs 151 and 152, and 161 and 162, is smaller in value than a predetermined current and thus the voltage drop by the resistor 212 is small, so the overcurrent detection transistor 214 is off.

On the other hand, when a large current flows through FETs 151 and 152, and 161 and 162, for the above reason, the resistor 212 provides a large voltage drop and thus the overcurrent detection transistor 214 turns on. Thus, the transistor 215 also turns on, and the overcurrent detection signal at the collector of the transistor 215 changes from high to low in level.

Then, since the overcurrent detection output signal is low in level, the microcomputer 22 supplies a control signal to the drive circuits 13 and 14 which will be caused by the control signal to suspend providing outputs. More specifically, receiving the control signal, the drive circuits 13 and 14 will suspend supplying the drive signals +PA and −PA, and +PB and −PB, to FETS 151 and 152, and 161 and 162. Thus, FETS 151 and 152 and 161 and 162 are all turned off, and no overcurrent will flow. Therefore, FETS 151 and 152, and 161 and 162, and the speaker 19 are protected.

Note that when the speaker 19 is connected to the speaker terminals SP+ and SP− and it is PWM-driven, the power amplifier will provide an output of more than several to 100 W.

In the aforementioned detection circuit construction, the source voltage +VDD is supplied to the push-pull circuits 15 and 16 through the overcurrent detection resistor 212. In the normal mode of operation, a current corresponding to an audio signal current i flowing to the speaker 19 flows through the resistor 212, so that the source voltage (voltage at the drains of FETS 151 and 161) of the push-pull circuits 15 and 16 will vary.

Thus, the circuit construction shown in FIG. 4 cannot provide minimum and maximum power amplifier outputs at a desired ratio.

DISCLOSURE OF THE INVENTION

It is therefore an object of the present invention to overcome the above-mentioned drawbacks of the related art by providing an improved and novel power amplifier.

The above object can be attained by providing a power amplifier including according to the present invention a first amplification circuit connected at an output terminal thereof to one end of a load and which makes noninverting-amplification of an input signal, a second amplification circuit connected at an output terminal thereof to the other end of the load and which makes inverting-amplification of an input signal, deviation detecting means for detecting a deviation between potentials at the output terminals of the first and second amplification circuits, and operation stopping means which works according to a detection output from the deviation detecting means to stop the first and second amplification circuits from operating.

In the normal mode of operation of the above power amplifier according to the present invention, both the potential at the output terminal of the first amplification circuit, to which the load is connected at one end thereof, and that at the output terminal of the second amplification circuit, to which the load is connected at the other end thereof, are a half of the source voltage.

On the other hand, if a speaker cord connected at one end thereof to one of speaker terminals is put in contact with a chassis or metal piece when a speaker is wired to the speaker terminals, for example, with the power amplifier kept energized, a large current will flow through an amplification element in the amplification circuit whose output terminal is the speaker terminal to which the speaker cord is connected and the potential at the output terminal of that amplification circuit falls.

Thus, the neutral potential at the output terminal of one of the amplification circuits deviates from that at the output terminal of the other amplification circuit, and the deviation is detected by the deviation detecting means. The operation stopping means substantially stops, on the basis the detection output from the deviation detecting means, the amplification circuit from operating. Thus, the amplification element in the amplification circuit and the load are protected.

The above amplification circuits may be a pulse width modulation (PWM) signal-driven switching amplifier. In this case, the above first amplification circuit includes a first pulse width modulation means for converting an input signal into a first pulse width modulation signal whose quantization level corresponds to its pulse width, a first driving means for converting a first pulse width modulation signal output from the first pulse width modulation means into a first pair of drive pulses whose levels are opposite to each other, and a first push-pull circuit formed from a first pair of switching elements pushpull-connected to each other, the first pair of switching elements being supplied with the first pair of drive pulses from the first driving means, and the first push-pull circuit being connected at the output terminal thereof to one end of a load. Also, the second amplification circuit includes a second pulse width modulation means for converting an input signal into a second pulse width modulation signal whose two's complement of quantization level corresponds to its pulse width, a second driving means for converting a second pulse width modulation signal output from the second pulse width modulation means into a second pair of drive pulses whose levels are opposite to each other, and a second push-pull circuit formed from a second pair of switching elements pushpull-connected to each other, the second pair of switching elements being supplied with the second pair of drive pulses from the second driving means, and the second push-pull circuit being connected at the output terminal thereof to the other end of a load. The deviation detecting means detects a deviation between potentials at the output terminals of the first and second push-pull circuits, respectively.

Also in this case, if one of the speaker terminals is put in contact with a chassis or metal piece when a speaker is wired to the speaker terminals, for example, with the power amplifier kept energized, a large current will flow through a switching element in the push-pull circuit whose output terminal is a grounded speaker terminal and the potential at the output terminal of that push-pull circuit falls.

Thus, the neutral potential at the output terminal of one of the push-pull circuits deviates from that at the output terminal of the other push-pull circuit, and the deviation is detected by the deviation detecting means. The operation stopping means substantially stops, on the basis the detection output from the deviation detecting means, the push-pull circuit from operating. Thus, the switching elements in the push-pull circuit and the load are protected.

Also the above object can be attained by providing a power amplifier including according to the present invention a first amplification circuit connected at an output terminal thereof to one end of a load and which makes noninverting-amplification of an input signal, a second amplification circuit connected at an output terminal thereof to the other end of the load and which makes inverting-amplification of an input signal, a deviation detecting means for detecting a deviation between potentials at the output terminals of the first and second amplification circuits, respectively, and a disconnecting means which works according to a detection output from the deviation detecting means to disconnect the load from the output terminal.

Also in this power amplifier, a deviation between the neutral potentials at the output terminals of the first and second amplification circuits, respectively, is detected by the deviation detecting means. The operation stopping means disconnects, on the basis the detection output from the deviation detecting means, the load from the output terminals of the first and second amplification circuits. Thus, the amplification element in the amplification circuit and the load are protected.

These objects and other objects, features and advantages of the present invention will become more apparent from the following detailed description of the preferred embodiments of the present invention when taken in conjunction with the accompanying drawings.

BEST MODE FOR CARRYING OUT THE INVENTION

The present invention will be described concerning embodiments in which the present invention is applied in the aforementioned digital audio signal power amplifier.

Figure 1:
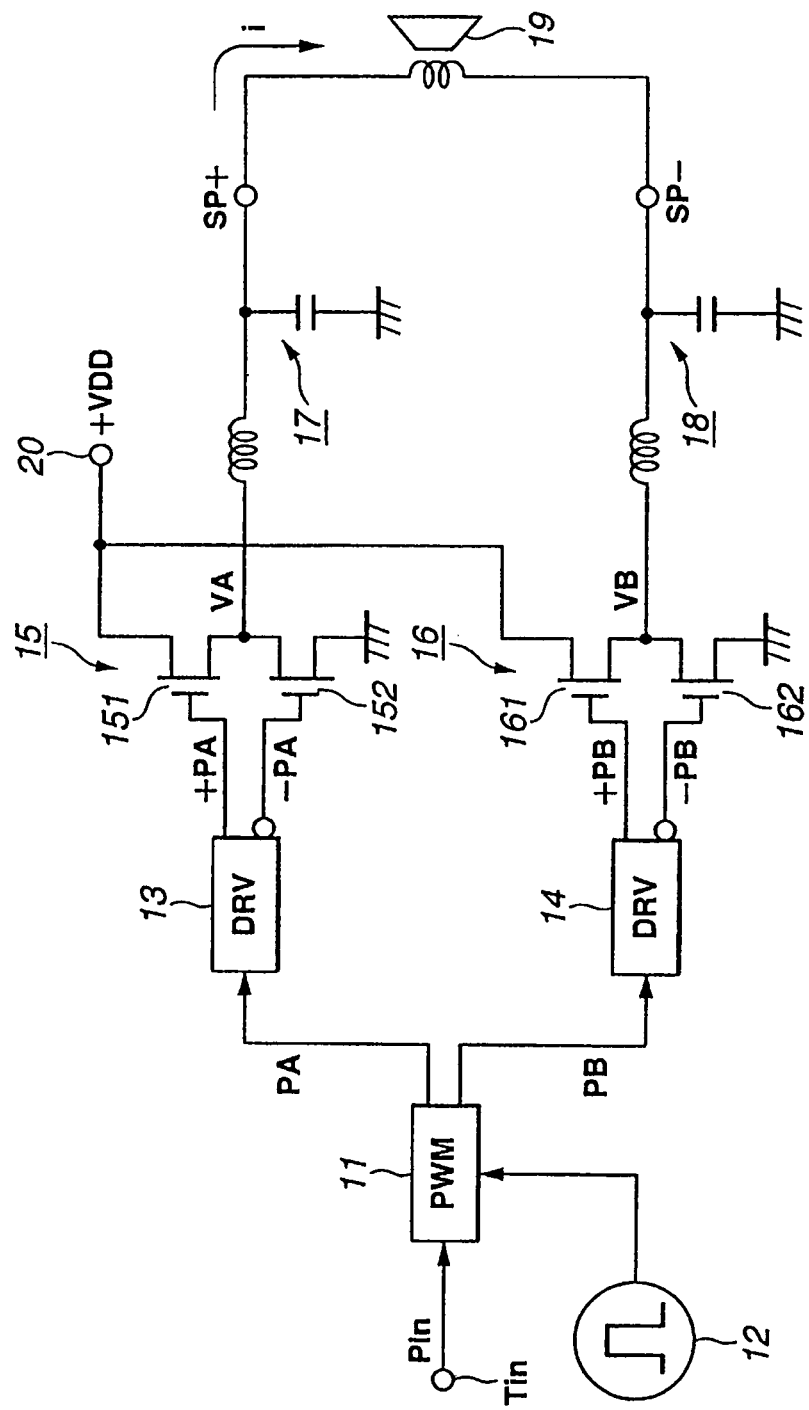
FIG. 1 is a circuit diagram of the PWM-driven power amplifier, showing an example construction of the latter.
Figure 2:
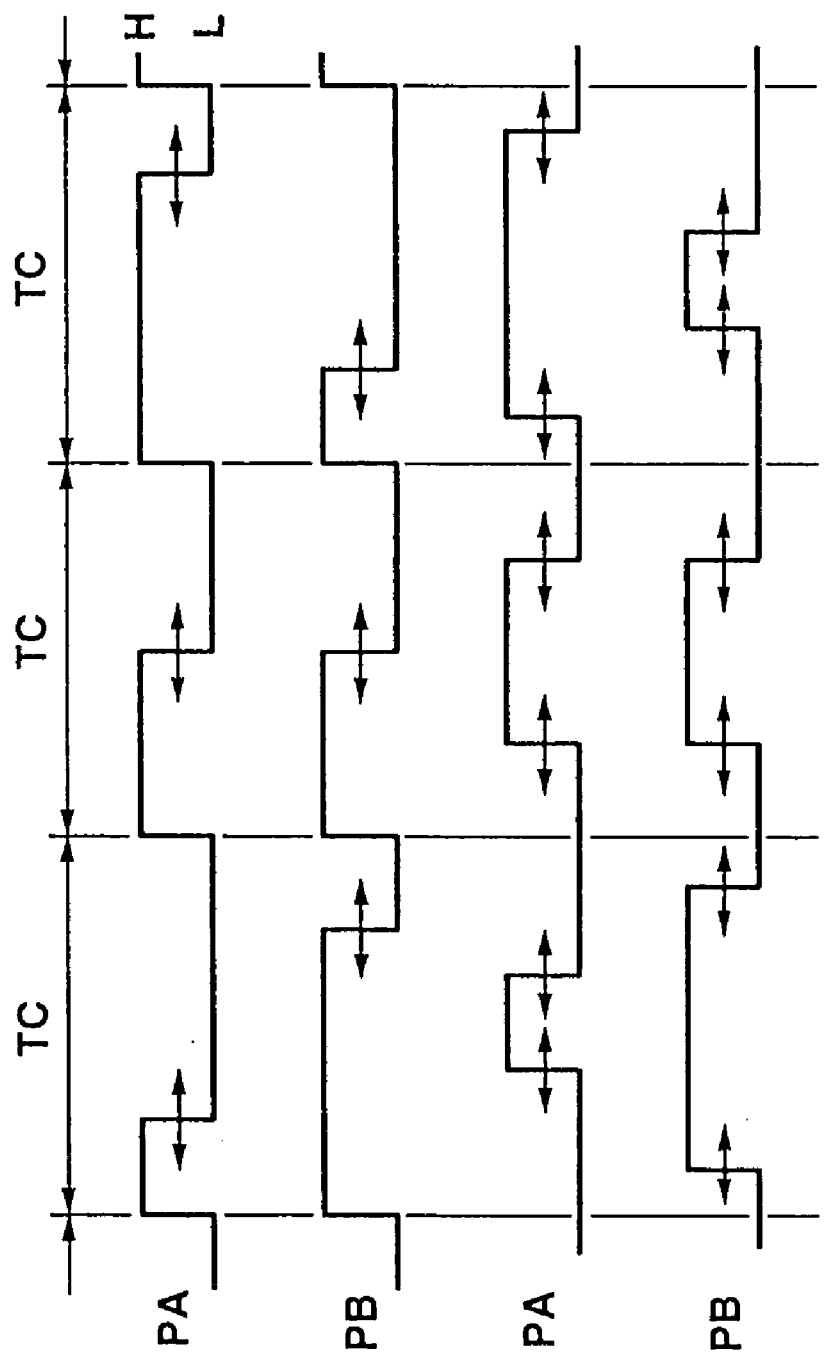
FIGS. 2A, 2B, 2C and 2D show together the operation of the power amplifier shown in FIG. 1.
Figure 3:
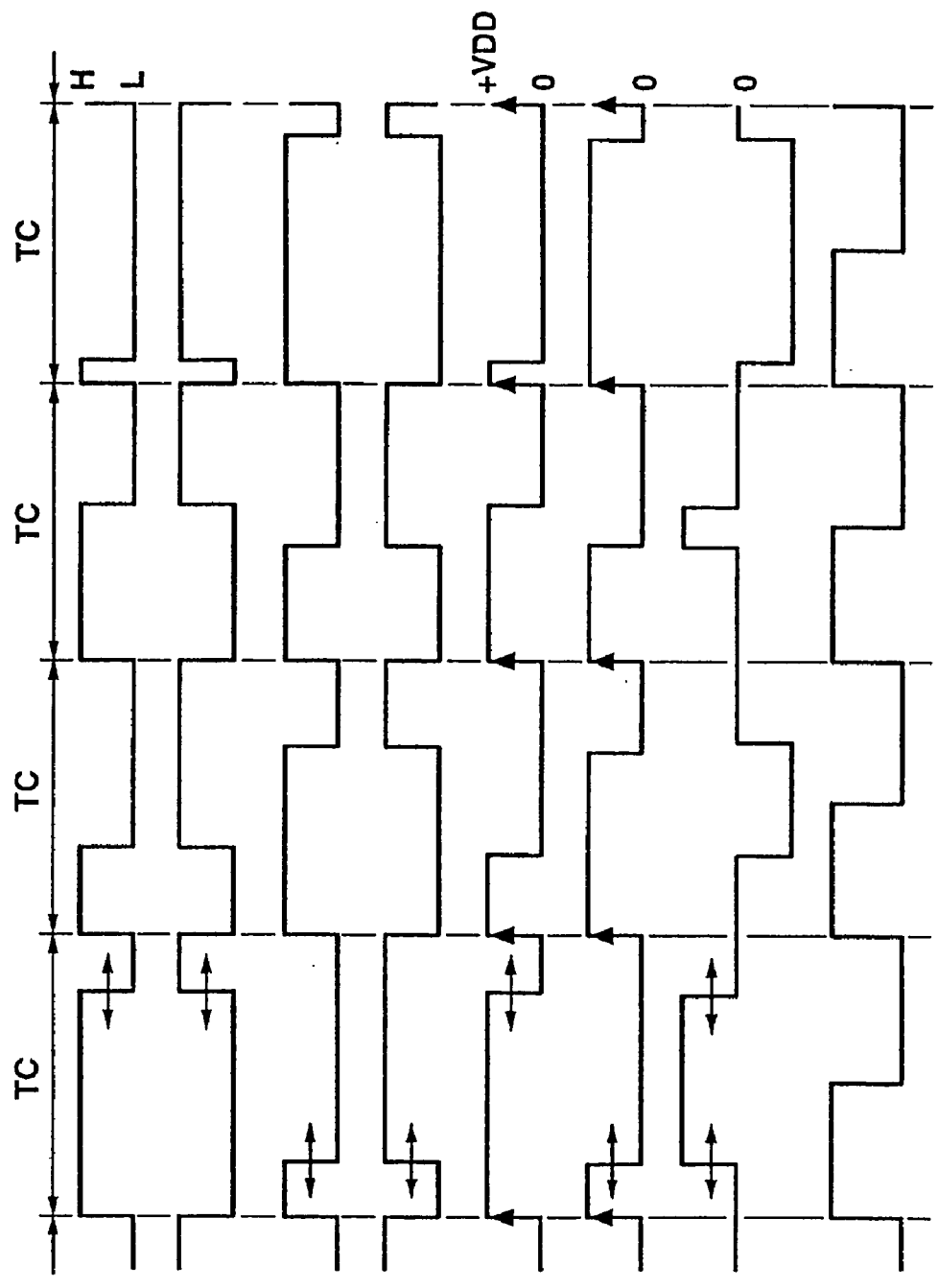
FIGS. 3A to 3F also explain together the operation of the power amplifier shown in FIG. 1.
Figure 5:
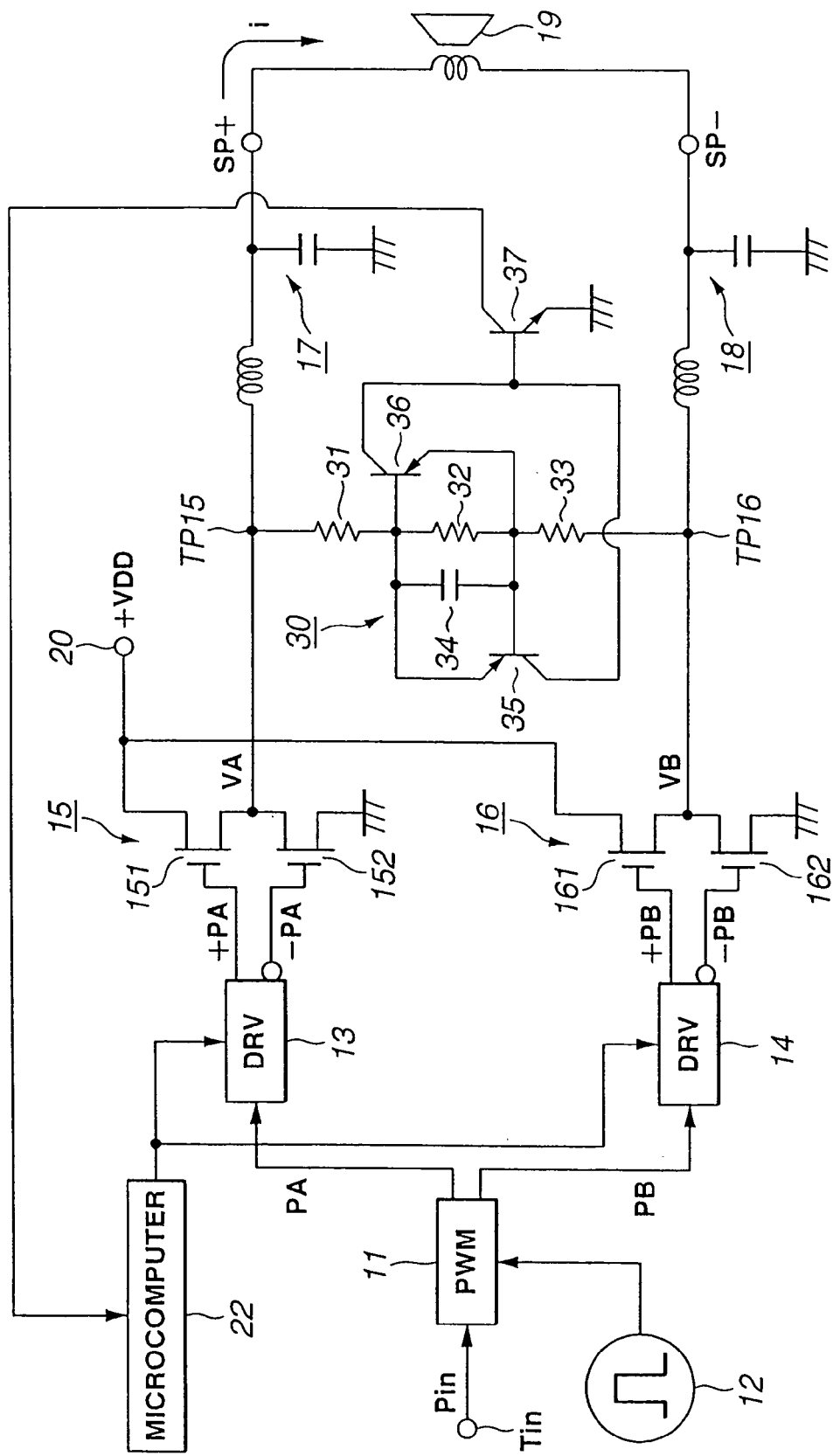
FIG. 5 is a circuit diagram of one embodiment of the power amplifier according to the present invention.

FIG. 5 is a circuit diagram of the power amplifier according to the present invention, showing the construction of the latter. The PWM-driven circuit part except for the overcurrent detection circuit part is quite the same as in FIG. 1.

In the power amplifier according to the present invention, a source voltage +VDD from a power terminal 20 is supplied, not via any resistor but directly, to push-pull circuits 15 and 16, differently from the conventional power amplifier having been described with reference to FIG. 4.

As shown, the overcurrent detection circuit, generally indicated with a reference 30, included in the power amplifier according to the present invention includes push-pull circuits 15 and 16 and a series circuit from resistors 31, 32 and 33 connected between a junction TP 15 between the source of FET 151 and drain of FET 152, which is an output terminal of the push-pull circuit 15, and a junction TP16 between the source of FET 161 and drain of FET 162, which is an output terminal of the push-pull circuit 16. Also, it includes a capacitor 34 connected in parallel with the central resistor 32. The capacitor 34 is provided to allow the overcurrent detection circuit 30 to operate with only a low frequency component.

The junction between the resistors 31 and 32 is connected to the emitter of a PNP transistor 35, and to the base of a PNP transistor 36 as well. The junction between the resistors 32 and 33 is connected to the base of the PNP transistor 35 and also to the emitter of the PNP transistor 36. The PNP transistors 35 and 36 are connected at the collectors thereof to each other, and the junction between the collectors is connected to the base of a transistor 37. The transistor 37 is connected at the emitter thereof to a ground potential, and an overcurrent detection output developed at the collector of the transistor 37 is supplied to a microcomputer 22.

In the normal mode of operation of the power amplifier constructed as above, both the potentials at the junctions TP15 and TP16 are a half of the source voltage, namely, +VDD/2, and the PWM-driven circuit part operates in quire the same manner as having been described above with reference of FIG. 4. At this time, since the potentials at the junctions TP15 and TP16 are the source-voltage half, no current flows through the overcurrent detection circuit 30 and the transistors 35 and 36 are both off and the transistor 37 is also off.

Figure 4:
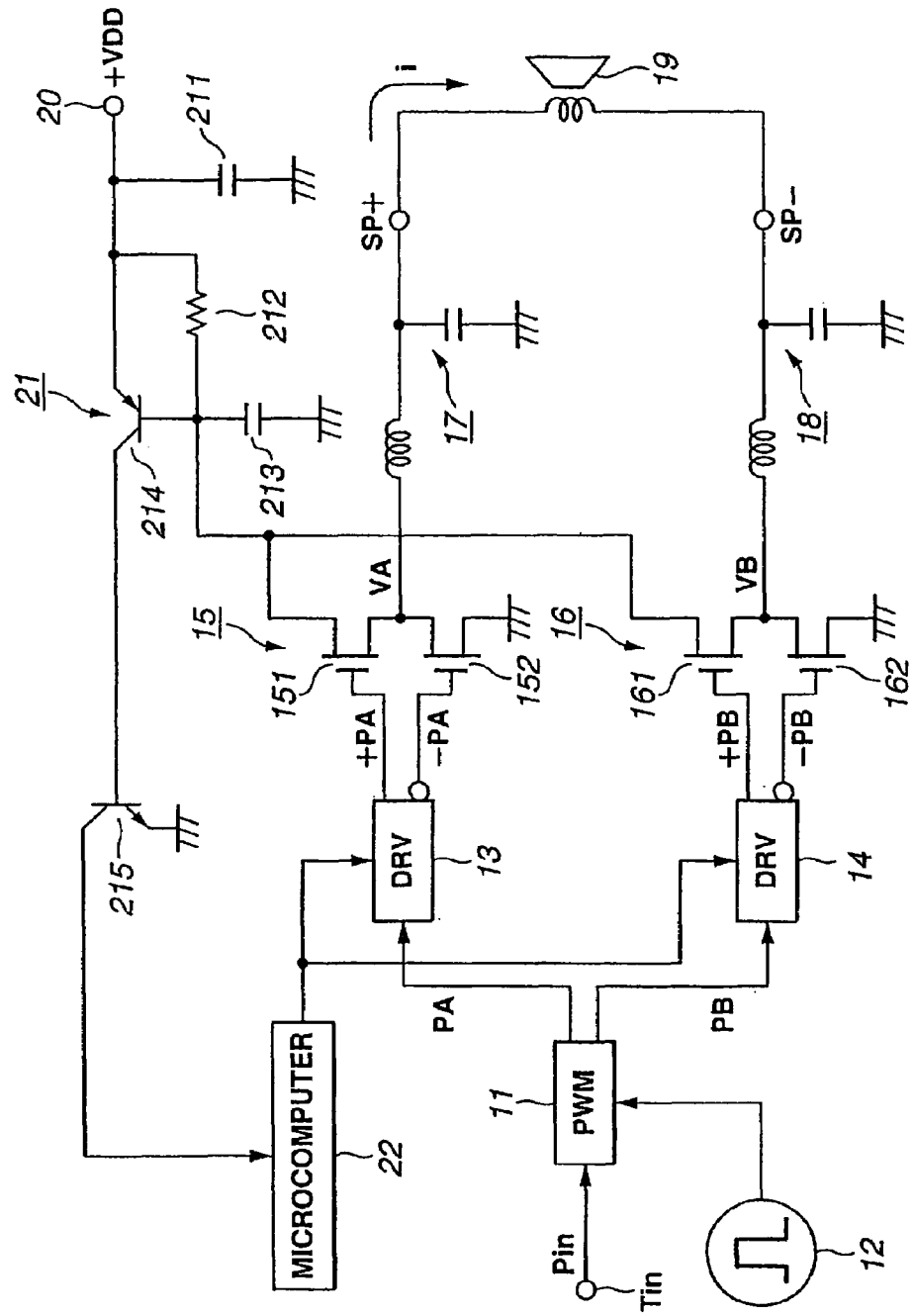
FIG. 4 is a circuit diagram of the power amplifier including the overcurrent protection circuit.

In this case, the push-pull circuits 15 and 16 are supplied directly with the source voltage +VDD from the power terminal 20, not as in the conventional power amplifier shown in FIG. 4, and so the reproduced sound from a speaker 19 will not incur such a level variation as in the conventional power amplifier shown in FIG. 4 and the sound quality not be degraded.

When a speaker terminal SP− is grounded for the aforementioned reason with the power amplifier shown in FIG. 5 being energized, the potential at the output terminal of the push-pull circuit 16, that is, the potential at the junction TP16, will be lower than the half of the source voltage.

Then, a current will flow from the junction TP15 toward the junction TP16, and the transistor 35 will turn on because of a voltage drop by the resistor 32. Thus, the transistor 37 will turn on and an overcurrent be detected. The overcurrent detection output is supplied to the microcomputer 22.

Based on the supplied overcurrent detection output, the microcomputer 22 controls the drive circuits 13 and 14 to get into an non-operating state and turn off all FETs 151 and 152, and 161 and 162, in the push-pull circuits 15 and 16. Thus, no overcurrent will flow through the push-pull circuit 16, so that FETs 161 and 162 will be protected and also the speaker 19, if connected as a load, be protected.

If the speaker terminal SP+ is grounded for the aforementioned reason with the power amplifier shown in FIG. 5 being energized, the potential at the output terminal of the push-pull circuit 15, that is, the potential at the junction TP15, will be lower than the half of the source voltage.

Then, a current will flow from the junction TP16 toward the junction TP15, and the transistor 36 will turn on because of a voltage drop by the resistor 32. Thus, the transistor 37 will turn on and an overcurrent be detected. The overcurrent detection output is supplied to the microcomputer 22.

Based on the supplied overcurrent detection output, the microcomputer 22 controls the drive circuits 13 and 14 to get into an non-operating state and turn off all FETs 151 and 152, and 161 and 162, in the push-pull circuits 15 and 16. Thus, no overcurrent will flow through the push-pull circuit 15, so that FETs 151 and 152 will be protected and also the speaker 19, if connected as a load, be protected.

As above, the overcurrent detection circuit 30 in the power amplifier according to the present invention protects FETs 151 and 152, and 161 and 162, as switching elements included in the push-pull circuits and the speaker as a load against an overcurrent, and assures to provide minimum and maximum power amplifier outputs at a designed ratio.

Note that in the above embodiment, the microcomputer 22 controls, based on the overcurrent detection output, the operation of the drive circuits 13 and 14 but it may be adapted to control, based on the overcurrent detection output, the PWM circuit 11 to stop outputting PWM signals PA and PB.

Also, the microcomputer 22 may be adapted to cut off power supply to the PWM circuit 11, drive circuits 13 and 14 and push-pull circuits 15 and 16 on the basis of the overcurrent detection output in order to substantially disenable the PWM circuit 11 and drive circuits 13 and 14.

Figure 6:
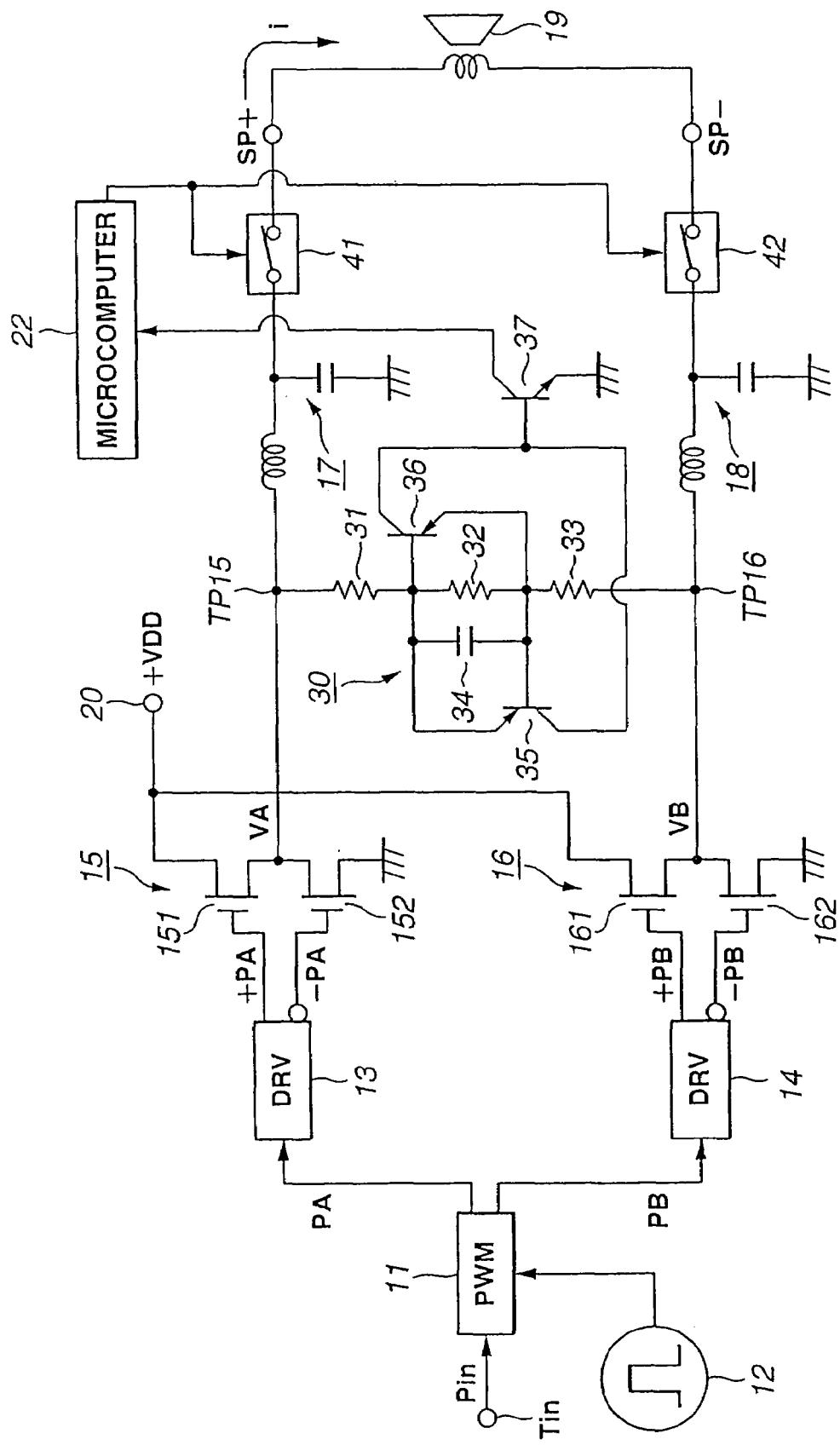
FIG. 6 is a circuit diagram of another embodiment of the power amplifier according to the present invention.

Also, as shown in FIG. 6, output cut-off switch circuits 41 and 42 which are normally on may be provided between the speaker terminal SP+ and a filter 17 and between the speaker terminal SP− and a filter 18, respectively, so that the microcomputer 22 will work, based on the overcurrent detection output, to turn off the switch circuits 41 and 42 when an overcurrent is detected. The reason why the switch circuits 41 and 42 are thus provided is that when the switch circuits 41 and 42 are turned off, the load is disconnected from the output terminal, whereby a current route causing a trouble will be broken.

In the overcurrent detection circuit 30 in the power amplifier according to the present invention, an overcurrent is detected with the use of one of the three resistors connected in series between the output terminals (junctions TP15 and TP16) of the push-pull circuits 15 and 16. Of course, however, the overcurrent detection circuit can be formed from a single resistor for example because it suffices to detect a potential change between the output terminals. Alternatively, the overcurrent detection circuit may be a circuit which can detect a deviation between potentials on the output terminals.

Figure 7:
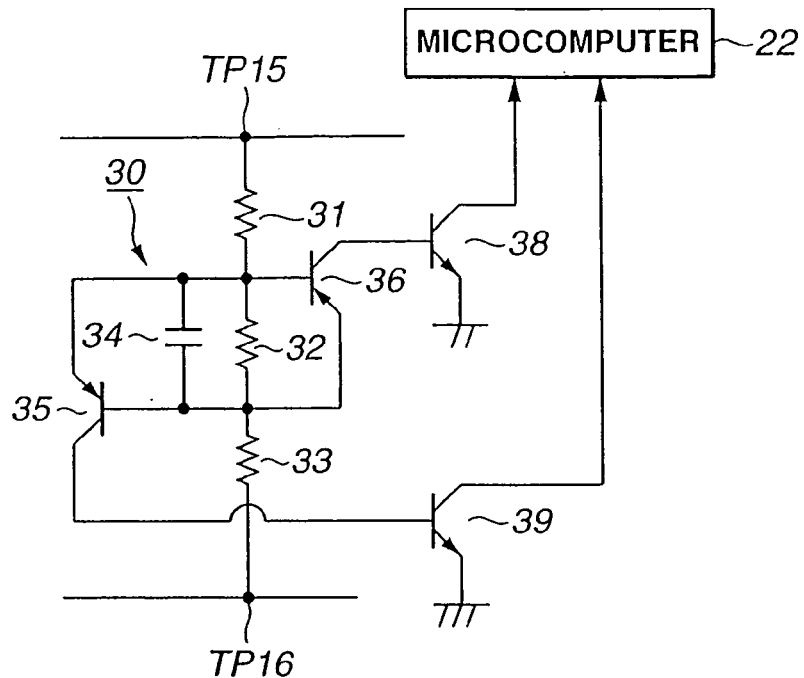
FIG. 7 is a circuit diagram of a variant of the overcurrent detection circuit used in the power amplifier according to the present invention.

The aforementioned overcurrent detection circuit 30 is designed such that when the potential on any of the junctions TP15 and TP16 deviates from the half of the source voltage, all FETs 151 and 152, and 161 and 162, in the push-pull circuits 15 and 16 are turned off. However, this overcurrent detection may be accomplished by detecting a deviation between potentials on the junctions TP15 and TP16 to judge through which of the push-pull circuits an overcurrent has flowed, and turning off FETs in only the push-pull circuit determined to have had the overcurrent flowed therethrough, as shown in FIG. 7. More specifically, when the potential at the junction TP16 is lower than the half of the source voltage, the transistor 35 turns on because of a voltage drop by the resistor 32 through which a current flows from the junction TP15 toward the junction TP16, so a transistor 39 turns on, an overcurrent through the junction TP16 is detected, and an overcurrent detection output is supplied to the microcomputer 22. On the basis of the supplied overcurrent detection output, the microcomputer 22 will turn off FETs 161 and 162 in the push-pull circuit 16. On the contrary, when the potential at the junction TP15 is lower than the half of the source voltage, the transistor 36 turns on because of a voltage drop by the resistor 32 through which a current flows from the junction TP16 toward the junction TP15, so a transistor 38 turns on, an overcurrent through the junction TP15 is detected, and an overcurrent detection output is supplied to the microcomputer 22. On the basis of the supplied overcurrent detection output, the microcomputer 22 will turn off FETs 151 and 152 in the push-pull circuit 15. Also in this case, the microcomputer 22 may of course be adapted to turn off all FETs 151 and 152, and 161 and 162, in the push-pull circuits 15 and 16 when supplied with an overcurrent detection output from any of the above overcurrent detection outputs.

Also in the above power amplifier, the overcurrent detection circuit 30 is connected between the output terminals of the push-pull circuits 15 and 16, but it may be connected between output terminals of low-pass filters 17 and 18, that is, between the speaker terminals SP+ and SP−. In this case, an output as an analog signal is provided at the output terminals of the low-pass filters 17 and 18. So, the time constant by the overcurrent detection resistor 32 and parallel capacitor 34 in the overcurrent detection circuit 30 has to be large.

Note that the above power amplifier has been described concerning an example in which the input signal Pin is a digital audio signal but the input signal may be an analog audio signal. Also, the PWM circuit 11 and drive circuits 13 and 14 may be formed integrally with each other. Further, the PWM circuit 11 and drive circuits 13 and 14 can of course be constructed as a hardware, and also each PWM signal may be produced by a software process executable by a digital signal processor (DSP) or microcomputer.

The power amplifier has been explained concerning a one using the push-pull circuits 15 and 16, but each of the push-pull circuits may be formed to have a single-end construction using a single switching element. In this case, each of FETs 152 and 162 may be replaced with a resistor, for example. In this case, the drive circuits 13 and 14 are not required.

Figure 8:
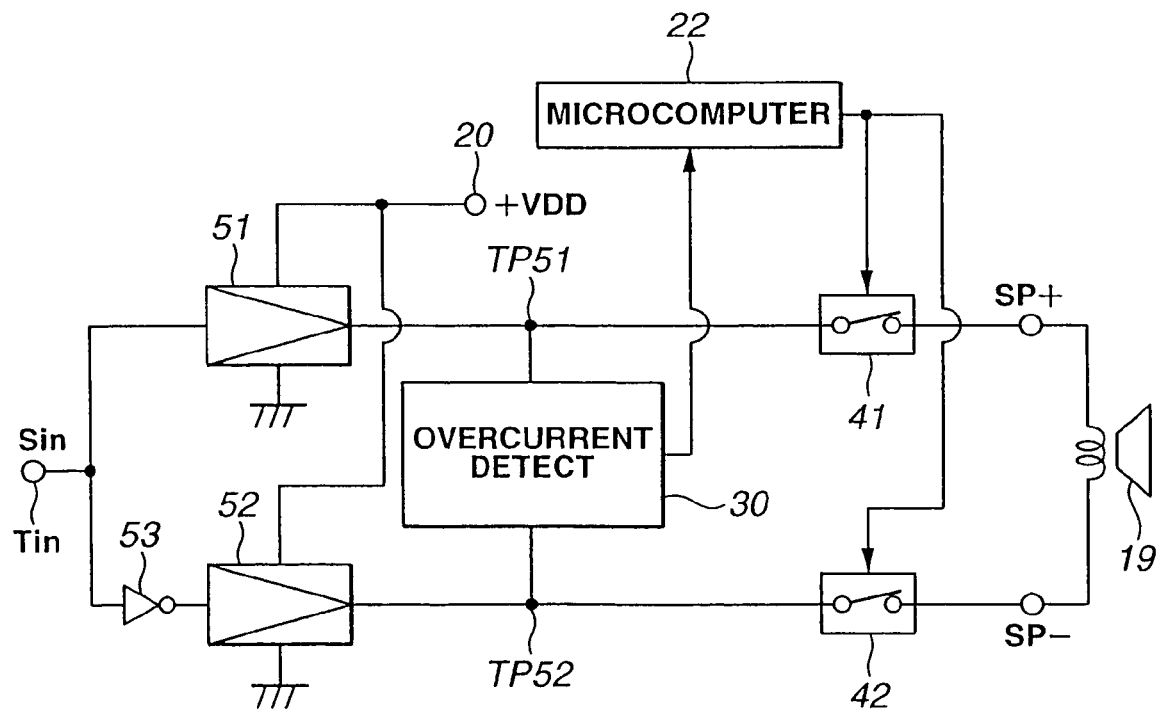
FIG. 8 is a block diagram of a still another embodiment of the power amplifier according to the present invention.

Further, the present invention is applicable to a power amplification circuit which is an analog circuit. FIG. 8 shows a power amplifier having the so-called BTL type construction by way of example. As shown, in the power amplifier, an analog audio signal Sin is supplied at an input terminal Tin, it is power-amplified by a noninverting-amplification circuit 51, and supplied to a speaker terminal SP+ to which the speaker 19 is connected at one end thereof via the switch circuit 41. On the other hand, the analog audio signal Sin is supplied to the noninverting amplification circuit 52 via an inverter 53. It is power-amplified by the power amplification circuit 52, and supplied to the speaker terminal SP– to which the speaker 19 is connected at the other end thereof via the switch circuit 42. The inverter 53 and noninverting amplification circuit 52 form together a noninverting power amplifier. Note that each of the power amplification circuits 51 and 52 is supplied at a power terminal 20 thereof with only a positive-pole DC voltage +VDD as a source voltage, for example, that is, it is supplied with a single power and the potential at the output terminal thereof is a half of the source voltage, namely, +VDD/2. Also in the power amplifier, an overcurrent detection circuit 30 is connected between the output terminals of the power amplification circuits, namely, between junctions TP51 and TP52. When the speaker terminal SP+ or SP– is grounded, an overcurrent is detected as in the aforementioned embodiments, and the microcomputer 22 provides a control to protect the power amplification circuits 51 and 52. As shown in FIG. 8, the microcomputer 22 turns off the switch circuits 41 and 42.

In the above, the present invention has been described concerning the audio amplifier. However, the present invention may be applied to an amplifier for driving a power apparatus such as a motor. Also, the power amplifier can supply an operating voltage to a load connected thereto in place of the speaker 19, and the voltage applied to the load can be changed in magnitude by changing the input signal Pin.

Note that in the aforementioned embodiments, the overcurrent detection output from the overcurrent detection circuit is supplied to the microcomputer which will disconnect the load, control the drive circuits and PWM circuit and control the power supply to each circuit but a dedicated control circuit, not the microcomputer, may separately be provided to make such kinds of control.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

INDUSTRIAL APPLICABILITY

As having been described in the foregoing, the present invention can overcome the drawbacks of the related art that minimum and maximum power amplifier outputs cannot be provided at a desired ratio and thus protect the switching circuits in the push-pull circuits and the load when an overcurrent flows.

The invention claimed is:

1. A power amplifier comprising:
   a first amplification circuit connected at an output terminal thereof to one end of a load and for making noninverting-amplification of an input signal;
   a second amplification circuit connected at an output terminal thereof to an other end of the load and for making inverting-amplification of an input signal;
   deviation detecting means for detecting a deviation between potentials at the output terminals of the first and second amplification circuits; and
   operation stopping means which works according to a deviation detection output from the deviation detecting means to stop the first and second amplification circuits from operating, wherein:
   the first amplification circuit includes:
   first pulse width modulation means for converting the input signal into a first pulse width modulation signal whose pulse width corresponds to a quantization level of the input signal, and
   a first switching circuit for performing a switching operation, according to a drive pulse from the first pulse width modulation means, wherein the output terminal thereof is connected to one end of the load; and
   the second amplification circuit includes:
   second pulse width modulation means for converting the input signal into a second pulse width modulation signal whose pulse width corresponds to two's complement of the quantization level of the input signal, and
   a second switching circuit for performing a switching operation, according to a drive pulse from the second pulse width modulation means, wherein the output terminal thereof is connected to the other end of the load.

2. The apparatus as set forth in claim 1, wherein the operation stopping means, based on the deviation detection output from the deviation detecting means, stops supplying a source voltage to at least any one of the first and second pulse width modulation means, and first and second switching circuits.

3. The apparatus as set forth in claim 1, wherein the operation stopping means, based on the deviation detection output from the deviation detecting means, stops the first and/or second pulse width modulation means from outputting a pulse width modulation signal.

4. A power amplifier comprising:
   a first amplification circuit connected at an output terminal thereof to one end of a load and for making noninverting-amplification of an input signal;
   a second amplification circuit connected at an output terminal thereof to an other end of the load and for making inverting-amplification of an input signal;
   deviation detecting means for detecting a deviation between potentials at the output terminals of the first and second amplification circuits; and
   operation stopping means which works according to a deviation detection output from the deviation detecting means to stop the first and second amplification circuits from operating, wherein:

the first amplification circuit includes:
first pulse width modulation means for converting the input signal into a first pulse width modulation signal whose pulse width corresponds to a quantization level of the input signal,
first driving means for converting the first pulse width modulation signal output from the first pulse width modulation means into a first pair of drive pulses whose levels are opposite to each other, and
a first push-pull circuit formed from a first pair of switching elements pushpull-connected to each other, the first pair of switching elements being supplied with the first pair of drive pulses from the first driving means, and the first push-pull circuit being connected at an output terminal thereof to one end of a load; and
the second amplification circuit includes:
second pulse width modulation means for converting the input signal into a second pulse width modulation signal whose pulse width corresponds to two's complement of the quantization level of the input signal,
second driving means for converting the second pulse width modulation signal output from the second pulse width modulation means into a second pair of drive pulses whose levels are opposite to each other, and
a second push-pull circuit formed from a second pair of switching elements pushpull-connected to each other, the second pair of switching elements being supplied with the second pair of drive pulses from the second driving means, and the second push-pull circuit being connected at an output terminal thereof to an other end of a load.

5. The apparatus as set forth in claim 4, wherein the operation stopping means, based on the deviation detection output from the deviation detecting means, stops supplying a source voltage to the first and/or second pulse width modulation means.

6. The apparatus as set forth in claim 4, wherein the operation stopping means, based on the deviation detection output from the deviation detecting means, stops the first and/or second pulse width modulation means from outputting a pulse width modulation signal.

7. The apparatus as set forth in claim 4, wherein the operation stopping means, based on the deviation detection output from the deviation detecting means, stops the first and/or second driving means from outputting the pair of drive pulses.

8. The apparatus as set forth in claim 4, wherein the operation stopping means, based on the deviation detection output from the deviation detecting means, stops supplying a source voltage to the first and/or second amplification circuit.

9. A power amplifier comprising:
a first amplification circuit connected at an output terminal thereof to one end of a load and for making noninverting-amplification of an input signal;
a second amplification circuit connected at an output terminal thereof to an other end of the load and for making inverting-amplification of an input signal;
deviation detecting means for detecting a deviation between potentials at the output terminals of the first and second amplification circuits; and
disconnecting means for working according to a deviation detection output from the deviation detecting means to disconnect the load from an output terminal, wherein:
the first amplification circuit includes:
first pulse width modulation means for converting the input signal into a first pulse width modulation signal whose pulse width corresponds to a quantization level of the input signal, and
a first switching circuit for performing a switching operation, according to a drive pulse from the first pulse width modulation means, wherein the output terminal thereof is connected to one end of the load; and
the second amplification circuit includes:
second pulse width modulation means for converting the input signal into a second pulse width modulation signal whose pulse width corresponds to two's complement of the quantization level of the input signal, and
a second switching circuit for performing a switching operation, according to a drive pulse from the second pulse width modulation means, wherein the output terminal thereof is connected to the other end of the load.

10. A power amplifier comprising:
a first amplification circuit connected at an output terminal thereof to one end of a load and for making noninverting-amplification of an input signal;
a second amplification circuit connected at an output terminal thereof to an other end of the load and for making inverting-amplification of an input signal;
deviation detecting means for detecting a deviation between potentials at the output terminals of the first and second amplification circuits; and
disconnecting means for working according to a deviation detection output from the deviation detecting means to disconnect the load from an output terminal, wherein:
the first amplification circuit includes:
first pulse width modulation means for converting the input signal into a first pulse width modulation signal whose pulse width corresponds to a quantization level of the input signal,
first driving means for converting the first pulse width modulation signal output from the first pulse width modulation means into a first pair of drive pulses whose levels are opposite to each other, and
a first push-pull circuit formed from a first pair of switching elements pushpull-connected to each other, the first pair of switching elements being supplied with the first pair of drive pulses from the first driving means, and the first push-pull circuit being connected at an output terminal thereof to one end of a load; and
the second amplification circuit includes:
second pulse width modulation means for converting the input signal into a second pulse width modulation signal whose pulse width corresponds to two's complement of the quantization level of the input signal,
second driving means for converting the second pulse width modulation signal output from the second pulse width modulation means into a second pair of drive pulses whose levels are opposite to each other, and
a second push-pull circuit formed from a second pair of switching elements pushpull-connected to each other, the second pair of switching elements being supplied with the second pair of drive pulses from the second driving means, and the second push-pull circuit being connected at an output terminal thereof to an other end of a load.

* * * * *